United States Patent [19]
Lee et al.

[11] Patent Number: 5,985,757
[45] Date of Patent: *Nov. 16, 1999

[54] METHOD FOR FABRICATING SEMICONDUCTOR DEVICE

[75] Inventors: Won Jae Lee; Seaung Suk Lee; Ho G. Kim; Jong Choul Kim, all of Kyoungki-do, Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/628,477

[22] Filed: Apr. 5, 1996

[30] Foreign Application Priority Data

Apr. 7, 1995 [KR] Rep. of Korea ............... 95-8133

[51] Int. Cl.$^6$ .......................... H01L 21/4763
[52] U.S. Cl. ................. 438/650; 438/686; 438/396
[58] Field of Search ................... 437/245, 192, 437/228; 428/648; 438/396, 650, 686

[56] References Cited

U.S. PATENT DOCUMENTS

| | | | |
|---|---|---|---|
| 4,870,033 | 9/1989 | Hotta et al. | 437/192 |
| 4,952,904 | 8/1990 | Johnson et al. | 338/36 |
| 5,122,477 | 6/1992 | Wolters et al. | 438/396 |
| 5,291,036 | 3/1994 | Tran et al. | 257/53 |
| 5,335,138 | 8/1994 | Sandu | 361/303 |
| 5,372,962 | 1/1994 | Hirota et al. | 437/47 |
| 5,596,214 | 1/1997 | Endo | 257/324 |
| 5,688,565 | 11/1997 | McMillan et al. | 427/565 |

FOREIGN PATENT DOCUMENTS

| | | |
|---|---|---|
| 0 535 736 A1 | 4/1993 | European Pat. Off. . |
| 0 609 081 A2 | 8/1994 | European Pat. Off. . |
| 3-093 232 | 7/1991 | Japan . |
| 3-114 230 | 8/1991 | Japan . |
| 6-200 366 | 7/1994 | Japan . |
| 6-326 270 | 11/1994 | Japan . |

OTHER PUBLICATIONS

Tsui, Bing–Yue, et al., "Dielectric Degradation of Pt/Sio$_2$/Si Structures During Thermal Annealing", *Solid–State Electronics*, vol. 36, No. 4, pp. 583–593 (1993).

Primary Examiner—Charles Bowers
Assistant Examiner—Reneé R. Berry
Attorney, Agent, or Firm—Thelen Reid & Priest, LLP

[57] ABSTRACT

A method for fabricating highly integrated semiconductor devices with capacitors having a dielectric film comprised of a thin film exhibiting a high dielectric constant to obtain a sufficient capacitance, involving the formation of an under electrode over a wafer formed with an oxide film at a high temperature, and annealing the resulting wafer in a vacuum such that the under electrode has a tight and smooth structure. By virtue of the tight and smooth structure of the under electrode, subsequent processing steps can be easily carried out. It is also possible to achieve an improvement in the reliability and uniformity of semiconductor devices as well as a high integration of such semiconductor devices.

3 Claims, 4 Drawing Sheets

METHOD FOR FABRICATING SEMICONDUCTOR DEVICE

BACKGROUND OF THE INVENTION

1. Field of the Invention

The present invention relates to a method for fabricating semiconductor devices, and more particularly to a technique for forming a smooth under electrode with a tight structure in order to form a dielectric film exhibiting a high dielectric constant in the fabrication of capacitors for highly integrated semiconductor devices.

2. Description of the Prior Art

Typically, electrodes of dielectric elements are employed in DRAM's and non-volatile FRAM's as under electrodes for dielectric thin films for the charge storage. They are also used as under electrodes for thin films of display elements in thin film infrared sensors, optical memories, optical switches and optical modulators.

In the case of DRAM's which use such under electrodes and include unit cells each consisting of one MOS transistor and one capacitor, the capacitance C of the capacitor can be expressed by the following equation:

$$C = (Eo \times Er \times A)/T$$

where, Eo represents the dielectric constant in vacuum, Er the dielectric constant of the dielectric film, A the area of the capacitor, and T the thickness of the dielectric film.

As understood from the equation relating to the capacitance C, the capacitance is proportional to the surface area of the storage electrode. In this regard, it is difficult to obtain a sufficient capacitance in highly integrated semiconductor devices because the high integration of semiconductor devices inevitably involves a reduction in cell dimension, thereby reducing the surface area of the storage electrode to which the capacitance is proportional. In the case of DRAM devices, it is important to reduce the cell dimension and yet obtain a high capacitance of the capacitor, for the high integration. As apparent from the above equation, the capacitance C can be increased by forming the dielectric film using a dielectric material exhibiting a high dielectric constant Er while reducing the thickness T of the dielectric film. In this case, however, the surface morphology of an under electrode disposed beneath the dielectric film serves as an important factor in the fabrication of capacitors. For example, where the under electrode has a rough surface morphology, namely, hillocks and pin holes at its surface, a degradation in electrical characteristic such as a short circuit may occur due to the hillocks and pin holes. Such a phenomenon results in a degradation in the stability and uniformity of capacitors. As a result, it is impossible to achieve an improvement in the reliability and productivity of semiconductor devices as well as a high integration of such semiconductor devices.

SUMMARY OF THE INVENTION

Therefore, an object of the invention is to solve the abovementioned problems involved in the prior art and to provide a method for fabricating a semiconductor device with an under electrode comprised of a thin film exhibiting a high dielectric constant, capable of reducing the phenomenon that a short circuit occurs due to hillocks and pin holes, thereby achieving an improvement in the reliability and uniformity of the semiconductor device.

In accordance with one aspect, the present invention provides a method for fabricating a highly integrated semiconductor device, comprising the steps of: maintaining, at a high vacuum state, a reaction chamber in which a wafer formed at its surface with a silicon oxide film is disposed; heating the wafer to an increased temperatue; forming a conductive layer as an under electrode for the semiconductor device over the wafer in the reaction chamber in accordance with a plasma deposition method; and annealing the resuming wafer to stabilize the conductive layer.

In accordance with another aspect, the present invention provides a method for fabricating a highly integrated semiconductor device, comprising the steps of: maintaining, at a high vacuum state, a reaction chamber in which a wafer formed at its surface with a silicon oxide film is disposed; heating the wafer to an increased temperature; forming a first target material layer over the wafer in accordance with a plasma deposition method; forming a is second target material layer over the first target material layer to form an under electrode for the semiconductor along with the first target material layer in accordance with a plasma deposition method; and annealing the resulting wafer to stabilize the first and second target material layers.

In accordance with the present invention, it is possible to obtain an under electrode having a tight and smooth surface morphology. Accordingly, ferroelectric thin films having a smooth surface and exhibiting a superior crystallinity can be fabricated.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
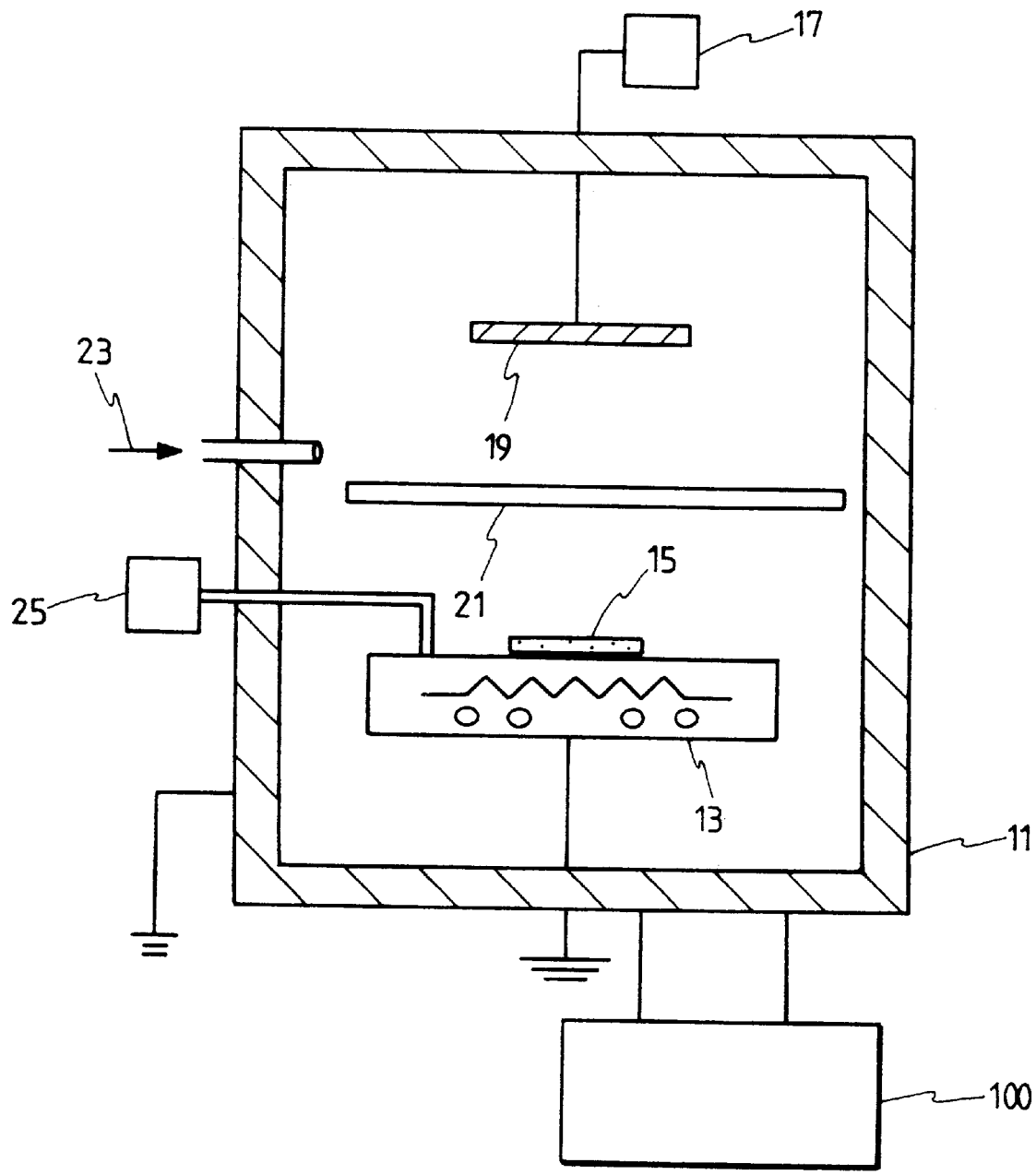
FIG. 1 is a schematic view illustrating a typical magnatron sputtering device.

Referring to FIG. 1, a sputtering device is shown, which is used to form electrode elements in accordance with an embodiment of the present invention wherein an under electrode having a single-layer structure is formed. As shown in FIG. 1, the sputtering device includes a reaction chamber 11 in which a heater 13 connected to an external thermocouple 25 is disposed to maintain the reaction chamber 11 at a desired temperature, as in a magnetron sputtering device. In the reaction chamber 11, a silicon wafer 15 formed with an electrode layer is arranged on the central portion of the heater 13. Above the heater 13, a shutter 21 is also disposed in the reaction chamber 11 so as to control the thickness of a platinum film which will be deposited over the wafer 15. A high-purity platinum target 19 is disposed above the shutter 21 in the reaction chamber 11. The platinum target 19 is electrically connected to a DC power supply unit 17. The reaction chamber 11 is connected to a vacuum pump 100 so that it can be maintained at a low pressure state or high vacuum state. Preferably, the vacuum pump 100 is a diffusion pump for generating a high vacuum ranging from several $10^{-5}$ Torr to several $10^{-6}$ Torr. The heater 13 is provided with Kantal in the interior thereof so that it can heat the water 1b from the normal temperature to 700° C. in a resistance-heating manner or other manner. On the wafer 15, a ferroelectric film containing platinum is deposited in accordance with a sputtering method to form capacitor electrodes. Alternatively, the ferroelectric film may contain titanium or tantalum in place of platinum.

Now, the procedure of depositing an under electrode for capacitors over a wafer using the above-mentioned sputtering device in accordance with the present invention will be described. In accordance with the present invention, the reaction chamber 11 is first exhausted by the diffusion pump so that it can be maintained at a high vacuum state ranging from several $10^{-5}$ Torr to several $10^{-6}$ Torr. At the high vacuum state of the reaction chamber 11, the wafer 15 is heated to a temperature of 350° C. to 450° C. for a period ranging from 30 minutes to one hour. Subsequently, the DC power supply unit 17 is activated to supply voltage of a certain level while introducing inert gas in the heated reaction chamber 11 so as to carry out a plasma deposition. That is, the DC power supply unit 17 supplies a voltage of 270 V to 310 V and a current of 0.05 A to 0.01 A to the platinum target 19 and the wafer 15 disposed in the reaction chamber 11 where argon gas 23 flows. As a result, plasma is generated, thereby causing platinum from the platinum target 19 to be deposited over the wafer 15.

In order to control the thickness of the platinum deposited over the wafer 15, a pre-sputtering is carried out for a sufficiently long time under the condition that the shutter 21 disposed between the platinum target 19 and wafer 15 is at its closed state. After completing the pre-sputtering, the shutter 21 is opened. At the opened state of the shutter 21, a sputtering is carried out.

After completing the sputtering, an annealing is carried out at a vacuum of $2\times10^{-6}$ Torr for 30 minutes under the condition that the wafer is maintained at a temperature of 600° C. to 700° C. The resulting wafer is then slowly cooled in the vacuum atmosphere.

Preferably, the thickness of the platinum film deposited over the wafer 15 is 80 nm to 120 nm. Although not shown, a silicon oxide film is interposed between the wafer 15 and the platinum film.

As a result, the wafer 15 has an under electrode (not shown) for capacitors which has a structure consisting of the platinum film. The surface morphology of the under electrode is improved by virtue of the above-mentioned annealing in vacuum.

In accordance with another embodiment of the present invention, the under electrode may have a double-layer structure. For instance, the under electrode has a double-layer structure comprised of a titanium or tantalum film and a platinum film sequentially deposited over the silicon oxide film of the silicon wafer 15. In this case, the same deposition condition as mentioned above are used for the platinum film. The titanium or tantalum film is deposited at the formal temperature to have a thickness of 20 nm to 30 nm. The platinum film deposited over the titanium or tantalum film has a thickness of 100 nm to 120 nm.

The surface morphology of the under electrode fabricated to have a single-layer structure consisting of the platinum film or a double-layer structure consisting of the titanium (or tantalum) and platinum films in accordance with the present invention varies depending on the deposition temperature of the platinum film. In order to find a deposition temperature range capable of obtaining an optimum stability, tests were carried out using X-ray diffraction (XRD) patterns respectively generated at various temperatures ranging from the normal temperature to 700° C. As a result of the tests, it was found that the optimum deposition temperature was 350° C. to 450° C. The XRD patterns are generated when the following equation is satisfied.

$$n\lambda = 2d \sin\theta$$

where, n represents the diffraction constant, $\lambda$ the wavelength of X-ray, d the distance, and $\theta$ the Bragg diffraction angle.

Figure 2:
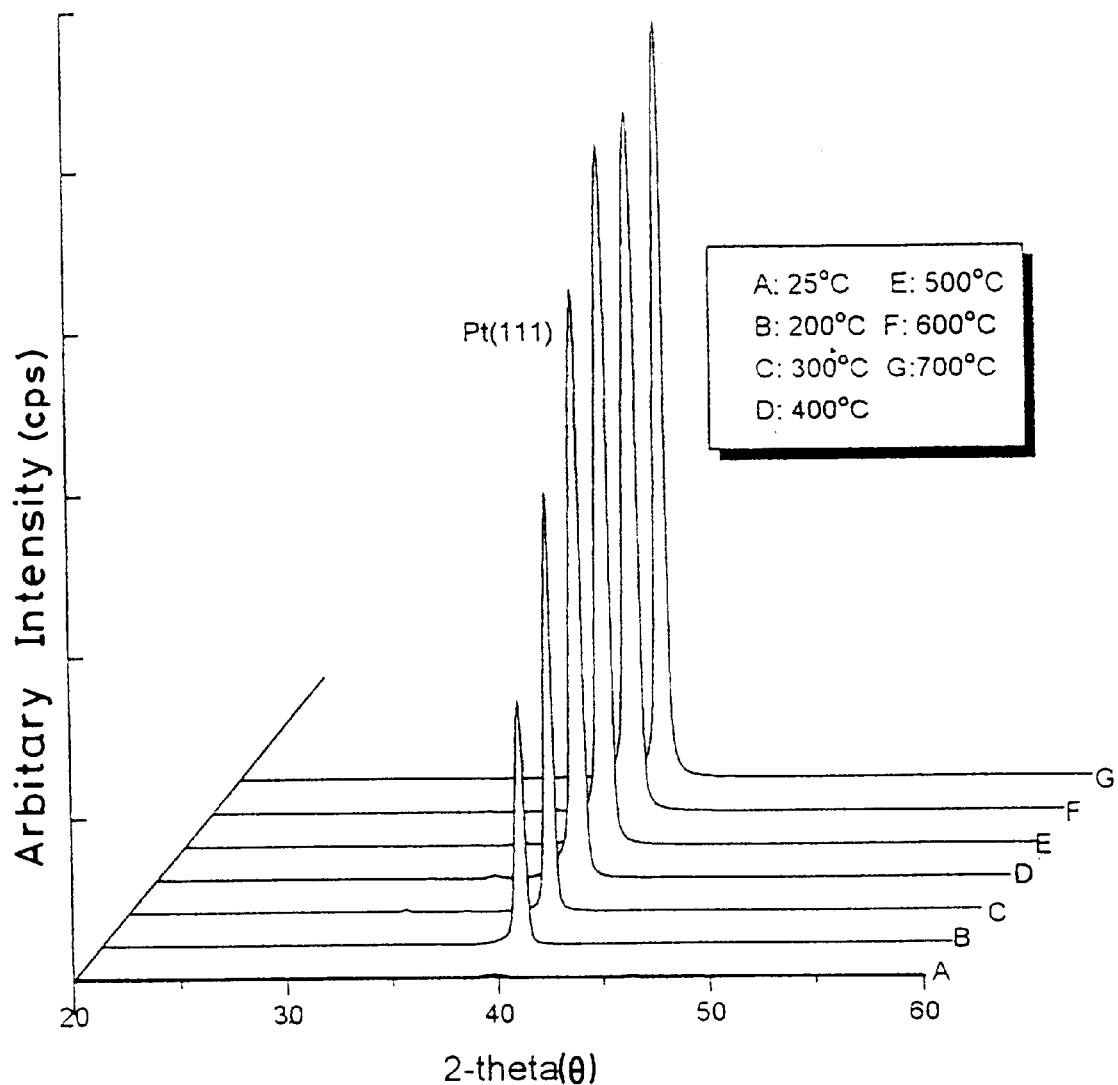
FIG. 2 is a graph showing X-ray diffraction (XRD) patterns respectively obtained at different deposition temperatures for the under electrode when a platinum thin film is deposited over a silicon wafer, in order to explain a method for forming a ferroelectric film in accordance with the present invention.

FIG. 2 is a graph showing XRD patterns respectively obtained at different deposition temperatures for the under electrode when a platinum thin film with a uniform thickness of 100 nm is deposited over a silicon oxide film formed on a wafer in accordance with the present invention. The XRD patterns of FIG. 2 are indicative of a variation in the intensity of X-ray (X-axis) to the Brag diffraction angle $\theta$ (Y-axis) depending on a variation in the deposition temperature for the under electrode during the formation of the under electrode carried out by depositing platinum from the platinum target 19 over the wafer 15 deposited with a silicon oxide film. Referring to the graph of FIG. 2, it can be found that the crystallinity and (111) orientation increase as the deposition temperature for the under electrode increases from 25° C. to 400° C. whereas they do not exhibit any considerable increase when the deposition temperature increases from a range of 350° C. to 450° C. In other words, the XRD patterns show that the under electrode exhibits the (111) orientation at deposition temperatures other than the normal temperature.

Where the under electrode is deposited at a deposition temperature ranging from the normal temperature to 200° C., its micro structure is not tight, thereby forming a number of pin holes and hillocks. As a result, the under electrode can not have a smooth surface. Although the under electrode has a tight structure when it is deposited at a deposition temperature of 600° C. or above, its structure may have pin holes. On the other hand, the under electrode has a very tight and smooth structure when it is deposited at a deposition temperature ranging from 350° C. to 450° C. The remaining hillocks are removed by the vacuum annealing. As a result, the under electrode becomes more smooth. The vacuum annealing is carried out under the above-mentioned conditions.

Figure 3:
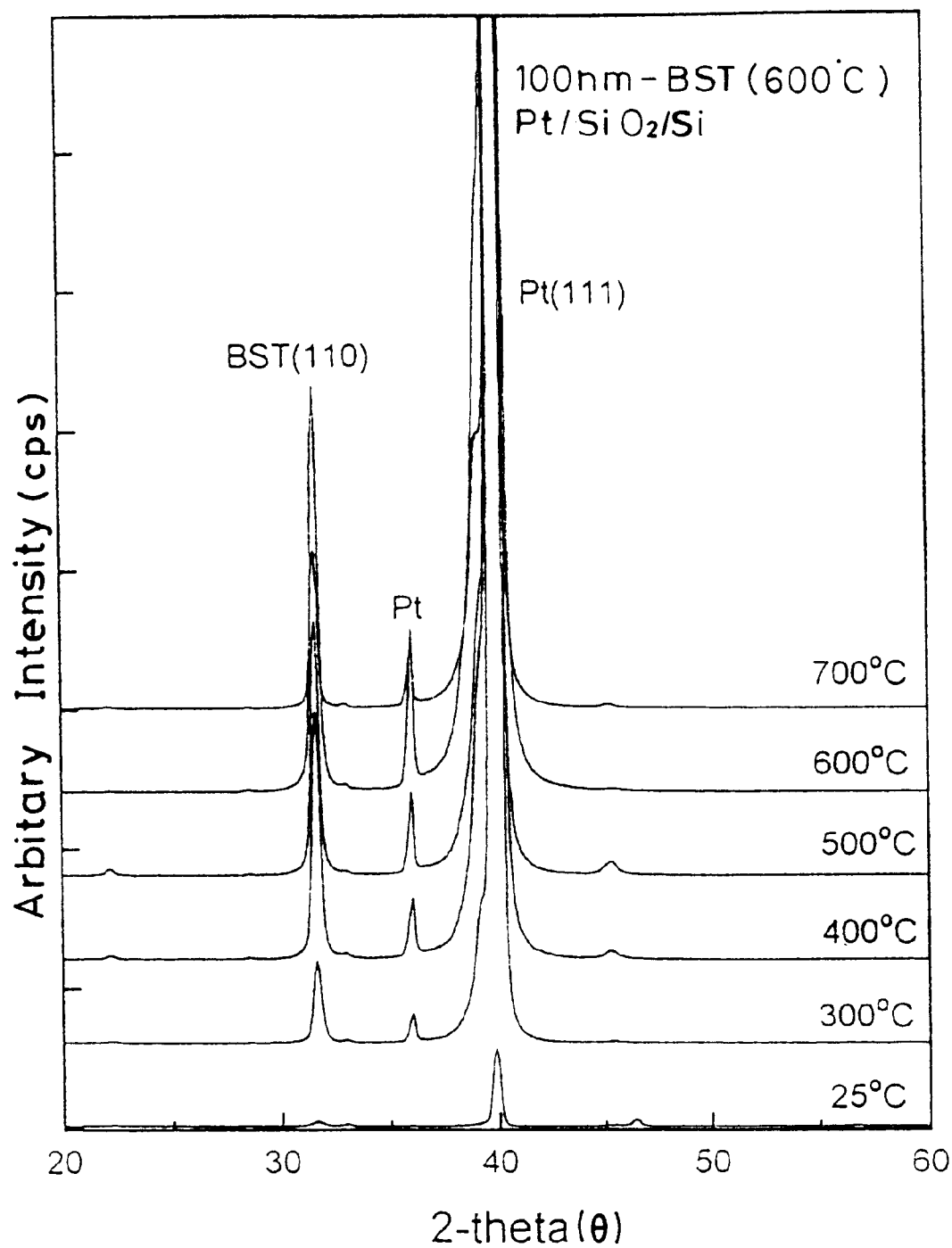
FIG. 3 is a graph showing XRD patterns respectively obtained at different deposition temperatures for the under electrode when a ferroelectric thin film made of barium strontium titanide (BST) is deposited over the under electrode comprised of the platinum thin film, in order to explain the method of the present invention.

FIG. 3 is a graph showing XRD patterns respectively obtained at different deposition temperatures for the under electrode when a ferroelectric thin film made of barium strontium titanide (BST) (not shown) is deposited over the under electrode comprised of the platinum thin film with a uniform thickness of 100 nm in accordance with the present invention. The BST film is deposited to a thickness of 100 nm at a temperature of 550° C. to 650° C. The XRD patterns of FIG. 3 are indicative of a variation in the intensity of X-ray (X-axis) to the Brag diffraction angle $\theta$ (Y-axis) depending on a variation in the deposition temperature for the under electrode during the formation of the BST film. Referring to the graph of FIG. 3, it can be found that the BST film has an (110) orientation. The crystallinity of the BST film varies greatly in accordance with the deposition temperature for the under electrode. The XRD patterns of FIG. 3 at deposition temperatures higher than 400° C. show similar picks.

Figure 4:
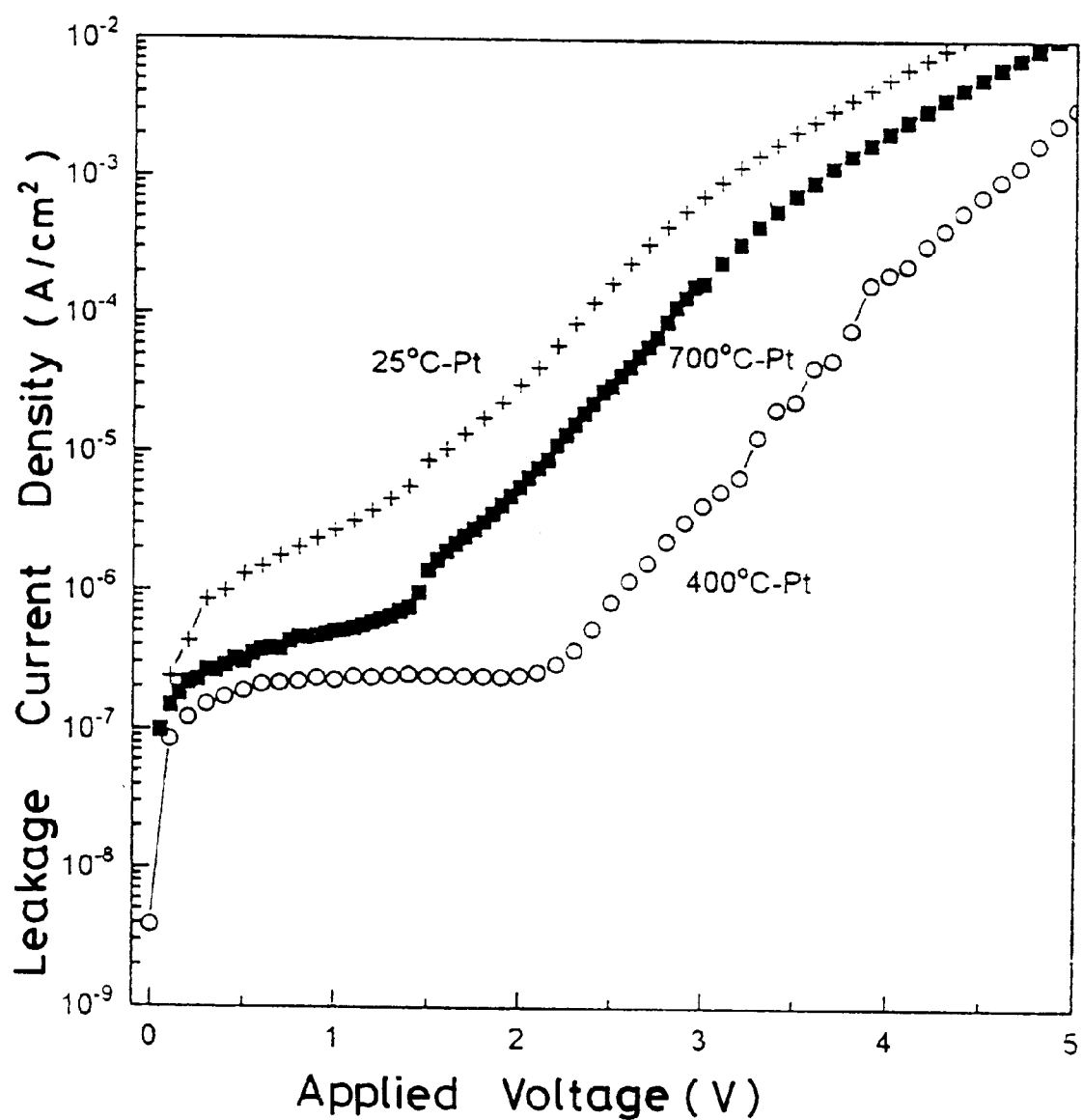
FIG. 4 is a graph showing leakage current characteristics of ferroelectric thin films respectively deposited at different deposition temperatures for the under electrode comprised of the platinum thin film depending on a variation in the applied voltage.

FIG. 4 shows a leakage current characteristic of a semiconductor device fabricated in accordance with the embodiment of the present invention shown in FIG. 3. FIG. 4 is a graph depicting leakage current characteristics of ferroelectric thin films respectively deposited at different deposition temperatures for the under electrode-made of platinum depending on a variation in the applied voltage. Referring to FIG. 4, it can be found that a superior leakage current characteristic is exhibited in the case of the ferroelectric thin film deposited over the under electrode deposited at a temperature of about 400° C. The amount of leaked. current in the case using the deposition temperature of about 700° C. is less than that in the case using the normal temperature. Also, the amount of leaked current in the case using the deposition temperature of about 400° C. is less than that in the case using the deposition temperature of about 700° C.

As apparent from the above description, in accordance with the present invention, an under electrode for capacitors of semiconductor devices is formed by depositing platinum over a wafer formed with an oxide film of a desired thickness at a deposition temperature ranging from 350° C. to 450° C. By virtue of such a deposition temperature, the under electrode can have a tight and smooth structure enabling the deposition of a ferroelectric thin film exhibiting a high dielectric constant. Accordingly, it is possible to achieve an improvement in the reliability and uniformity of semiconductor devices as well as a high integration of such semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a highly integrated semiconductor device, comprising:

a) maintaining, at a high vacuum state ranging from several $10^{-5}$ Torr to several $10^{-6}$ Torr, a reaction chamber of a sputtering device containing a wafer on whose surface a silicon oxide film is formed;

b) heating the wafer to a temperature of 350° C. to 450° C.;

c) carrying out a pre-sputtering process under introducing inert gas in the reaction chamber and covering a platinum target in a state in which a shutter between the platinum and the wafer has been closed to adjust to a thickness of the platinum target;

d) carrying out a sputtering process using the platinum target:

d1) at the temperature of 350° C. to 450° C.

d2) using a voltage of 270 V to 310 V d3) at a current range of 0.05 A to 0.10 A, to form a platinum layer for an under-electrode of a capacitor over the oxide film after the shutter has been opened;

e) stabilizing the platinum layer by annealing the resulting wafer:

e1) in a vacuum atmosphere maintained at a pressure of several $10^{-5}$ Torr to several $10^{-6}$ Torr;

while the wafer is maintained:

e2) for 30 minutes e3) at a temperature ranging from 600° C. to 700° C.; and f) slowly cooling the wafer in the vacuum atmosphere.

2. The method in accordance with claim 1, wherein:

the platinum layer has a thickness of 70 nm to 90 nm.

3. A method for fabricating a highly integrated semiconductor device, comprising:

maintaining, at a high vacuum state, a reaction chamber of a sputtering device containing a wafer on whose surface a silicon oxide film is formed;

carrying out a pre-sputtering process under introducing inert gas in the reaction chamber and covering a first target material of tantalum or titanium;

carrying out a sputtering process using the tantalum or titanium first target material at a normal temperature to form a tantalum or titanium layer for an under-electrode of a capacitor over the silicon oxide film;

carrying out a sputtering process using a second target material of platinum at a temperature of 350° C. to 450° C. to form a platinum layer for an under-electrode of a capacitor over the tantalum or titanium layer;

stabilizing the tantalum or titanium layer and the platinum layer by annealing the resulting wafer in a vacuum atmosphere maintained at a pressure of several $10^{-5}$ Torr to several $10^{-6}$ Torr while the wafer is maintained at a temperature ranging from 600° C. to 700° C.; and slowly cooling the wafer in the vacuum atmosphere.

* * * * *